(12) United States Patent
Ilkorur et al.

(10) Patent No.: US 12,713,185 B2
(45) Date of Patent: Aug. 18, 2026

(54) CYLINDRICAL MEMS STRUCTURES FOR AUDIO COMPONENTS

(71) Applicant: Apple Inc., Cupertino, CA (US)

(72) Inventors: Onur I. Ilkorur, Santa Clara, CA (US); Christopher Wilk, Los Gatos, CA (US); Gokhan Hatipoglu, Milpitas, CA (US); Peter C. Hrudey, San Jose, CA (US)

(73) Assignee: Apple Inc., Cupertino, CA (US)

( * ) Notice: Subject to any disclaimer, the term of this patent is extended or adjusted under 35 U.S.C. 154(b) by 223 days.

(21) Appl. No.: 18/239,114

(22) Filed: Aug. 28, 2023

(65) Prior Publication Data

US 2024/0121559 A1 Apr. 11, 2024

Related U.S. Application Data

(60) Provisional application No. 63/420,528, filed on Oct. 28, 2022, provisional application No. 63/414,081, filed on Oct. 7, 2022.

(51) Int. Cl.
*H04R 19/02* (2006.01)
*B81B 3/00* (2006.01)
*H04R 1/02* (2006.01)

(52) U.S. Cl.
CPC .......... *H04R 19/02* (2013.01); *B81B 3/0021* (2013.01); *H04R 1/025* (2013.01); *B81B 2201/0257* (2013.01); *H04R 2201/003* (2013.01)

(58) Field of Classification Search
CPC .. H04R 19/02; H04R 1/025; H04R 2201/003; H04R 19/005; B81B 3/0021; B81B 2201/0257; B81B 2201/038
See application file for complete search history.

(56) References Cited

U.S. PATENT DOCUMENTS 3,636,278 A * 1/1972 Heil .......................... H04R 7/14 381/163
3,685,609 A * 8/1972 Franssen .................. H04R 1/30 181/173

(Continued)

FOREIGN PATENT DOCUMENTS

EP 2758335 7/2014
EP 3143778 B1 6/2021

OTHER PUBLICATIONS

"New Eminence Speakers for 2014," Voice Coil, 2014, retrieved from http://www.bzspeakers.com/pd_data/Bozhen_DDQ_VC_2014_7.pdf, 3 pages.

(Continued)

*Primary Examiner* — Oyesola C Ojo
(74) *Attorney, Agent, or Firm* — BAKERHOSTETLER

(57) ABSTRACT

Aspects of the subject technology relate to electronic devices having speakers such as microelectromechanical systems (MEMS) speakers. A MEMS speaker can include cylindrical corrugated MEMS structure. The cylindrical corrugated MEMS structure may include a contiguous MEMS structure with corrugations that run around an open cylindrical core that is defined, in part, by interior folds of the corrugations. The cylindrical corrugated MEMS structure may be deformed, responsive to an applied voltage, such that a portion of the cylindrical corrugated MEMS structure bends into and/or out of the open cylindrical core to push air out of and/or pull air into the open cylindrical core. In one or more implementations, a MEMS speaker may include an array of cylindrical corrugated MEMS structures.

20 Claims, 9 Drawing Sheets

(56) References Cited

U.S. PATENT DOCUMENTS

| | | | | |
|---|---|---|---|---|
| 4,276,449 | A * | 6/1981 | Sawafuji | H04R 9/047 381/408 |
| 4,903,308 | A * | 2/1990 | Paddock | H04R 7/02 181/173 |
| 5,132,942 | A * | 7/1992 | Cassone | B06B 1/0655 29/25.35 |
| 5,249,237 | A * | 9/1993 | Paddock | H04R 9/047 381/186 |
| 6,028,389 | A * | 2/2000 | Bernstein | H04R 17/00 310/311 |
| 6,061,461 | A * | 5/2000 | Paddock | H04R 9/06 381/186 |
| 9,584,941 | B2 * | 2/2017 | Dehe | H04R 1/005 |
| 10,111,021 | B2 * | 10/2018 | Deas | H04R 19/005 |
| 10,442,683 | B2 * | 10/2019 | Saxena | B81C 1/00333 |
| 10,567,866 | B1 * | 2/2020 | Liang | H04R 9/06 |
| 10,595,108 | B2 * | 3/2020 | Kim | H04R 7/14 |
| 10,623,848 | B2 * | 4/2020 | Teng | H04R 1/1075 |
| 10,667,038 | B2 | 5/2020 | Agshe et al. | |
| 11,595,758 | B2 | 2/2023 | Hatipoglu | |
| 2002/0097637 | A1 * | 7/2002 | Pearce | G01V 1/201 367/154 |
| 2007/0154028 | A1 * | 7/2007 | Oxford | H04R 9/06 381/71.7 |
| 2014/0247955 | A1 | 9/2014 | Nyström | |
| 2014/0321692 | A1 * | 10/2014 | Bay | H04R 1/403 381/398 |
| 2017/0041717 | A1 * | 2/2017 | Zou | B81C 1/00158 |
| 2017/0105072 | A1 * | 4/2017 | Katsumata | H04R 1/025 |
| 2017/0201834 | A1 * | 7/2017 | Nozaki | H04R 7/16 |
| 2018/0035229 | A1 * | 2/2018 | Deas | H04R 31/006 |
| 2020/0178000 | A1 | 6/2020 | Niekiel et al. | |
| 2021/0029470 | A1 * | 1/2021 | Nawaz | G01L 9/0072 |
| 2023/0015144 | A1 * | 1/2023 | Chen | B81C 1/00158 |
| 2024/0121559 | A1 * | 4/2024 | Ilkorur | H04R 19/02 |

OTHER PUBLICATIONS

Kaiser, et al., "Concept and proof for an all-silicon MEMS micro speaker utilizing air chambers", Microsyst Nanoeng, 2019; 5:43. Published Oct. 7, 2019. doi: 10.1038/s41378-019-0095-9.

Tymphany LAT 700 Subwoofer, specification sheet, 2009, retrieved from https://www.tymphany.com/wp-content/uploads/2018/10/Discontinued-Tymphany-LAT-Products-LAT700-001.pdf, 2 pages.

Vietnamese Patent Application No. 1-2023-07006, Results of Substantive Examination, dated Mar. 10, 2026, 4 pages including English Translation.

* cited by examiner

CYLINDRICAL MEMS STRUCTURES FOR AUDIO COMPONENTS

CROSS REFERENCE TO RELATED APPLICATIONS

This application claims the benefit of priority to U.S. Provisional Patent Application No. 63/420,528, entitled, "Cylindrical Mems Structures for Audio Components", filed on Oct. 28, 2022, and U.S. Provisional Patent Application No. 63/414,081, entitled, "Cylindrical Mems Structures for Audio Components", filed on Oct. 7, 2022, the disclosure of each which is hereby incorporated herein in its entirety.

TECHNICAL FIELD

The present description relates generally to electronic devices including, for example, to microelectromechanical systems (MEMS) speakers.

BACKGROUND

Electronic devices such as computers, media players, cellular telephones, wearable devices, and headphones are often provided with speakers for generating sound output from the device. However, particularly as devices are implemented in ever smaller form factors, and as user demand for high quality audio increases, it can be challenging to provide speakers that generate high quality sound, particularly in compact devices such as portable electronic devices.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

Portable electronic devices such as a mobile phones, portable music players, smart watches, tablet computers, laptop computers, other wearable devices, headphones, earbuds, and the like often include a speaker for generating sound.

In accordance with various aspects of the subject disclosure, a speaker is provided that includes a cylindrical corrugated MEMS structure. The speaker, which is referred to herein variously as a MEMS speaker or a micro-speaker, may be implemented with corrugations in a cylindrical MEMS structure having an open cylindrical core. The open cylindrical core can be fluidly coupled to and/or can form part or all of a front volume of the MEMS speaker.

In one or more implementations, the speaker can include multiple cylindrical corrugated MEMS structures, such as an array of cylindrical corrugated MEMS structures. One or more cylindrical corrugated MEMS structures can be mounted between a front volume and a back volume of the speaker. The cylindrical MEMS structure may be deformed, by an applied voltage, to bend at locations between top and bottom fixed edges that are sealingly fixed to top and bottom substrates to generate sound while preventing leakage of air around the top and bottom fixed edges.

Figure 1:
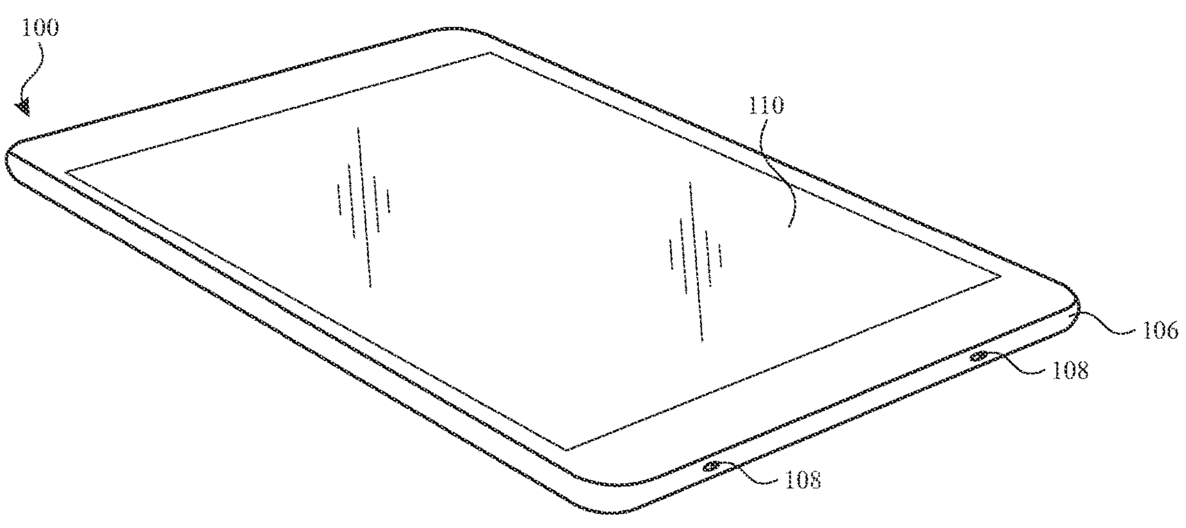
FIG. 1 illustrates a perspective view of an example electronic device having a MEMS speaker in accordance with various aspects of the subject technology.

An illustrative electronic device including a speaker is shown in FIG. 1. In the example of FIG. 1, device 100 (e.g., an electronic device) has been implemented using a housing that is sufficiently small to be portable and carried by a user (e.g., device 100 of FIG. 1 may be a handheld electronic device such as a tablet computer or a cellular telephone or smart phone). As shown in FIG. 1, device 100 includes a display such as display 110 mounted on the front of housing 106. Device 100 includes one or more input/output devices such as a touch screen incorporated into display 110, a button or switch and/or other input output components disposed on or behind display 110 or on or behind other portions of housing 106. Display 110 and/or housing 106 include one or more openings to accommodate button, a speaker, a light source, or a camera.

In the example of FIG. 1, housing 106 includes two openings 108 on a bottom sidewall of the housing. One or more of openings 108 forms a port for an audio component. For example, one of openings 108 may form a speaker port for a speaker disposed within housing 106 and another one of openings 108 may form a microphone port for a microphone disposed within housing 106. Openings 108 may be open ports or may be completely or partially covered with a permeable membrane or a mesh structure that allows air and sound to pass through the openings. Although two openings 108 are shown in FIG. 1, this is merely illustrative. One opening 108, two openings 108, or more than two openings 108 may be provided on the bottom sidewall (as shown) on another sidewall (e.g., a top, left, or right sidewall), on a rear surface of housing 106 and/or a front surface of housing 106 or display 110. In some implementations, one or more groups of openings 108 in housing 106 may be aligned with a single port of an audio component within housing 106. Housing 106, which may sometimes be referred to as a case, may be formed of plastic, glass, ceramics, fiber composites, metal (e.g., stainless steel, aluminum, etc.), other suitable materials, or a combination of any two or more of these materials.

The configuration of device 100 of FIG. 1 is merely illustrative. In other implementations, device 100 may be a computer such as a computer that is integrated into a display such as a computer monitor, a laptop computer, a smaller portable device such as a smart watch, a pendant device, or other wearable or miniature device, a media player, a gaming device, a navigation device, a computer monitor, a television, a headphone, an earbud, or other electronic equipment. In some implementations, device 100 may be provided in the form of a computer integrated into a computer monitor. Display 110 may be mounted on a front surface of housing 106 and a stand may be provided to support housing (e.g., on a desktop).

In some implementations, device 100 may be provided in the form of a wearable device such as a smart watch. In one or more implementations, housing 106 may include one or more interfaces for mechanically coupling housing 106 to a strap or other structure for securing housing 106 to a wearer. It should be appreciated that, although device 100 includes one opening in the example of FIG. 1, device 100 may include one, two, three, four, or more than four openings. Device 100 may include one, two, three, or more than three audio components each mounted adjacent to one or more of openings 108.

A speaker disposed within housing 106 transmits sound through at least one associated opening 108. A microphone may also be provided within housing 106 that receives sound through at least one associated opening in the housing. In one or more implementations, the speaker may be implemented as a microelectromechanical systems (MEMS) speaker.

Figure 2:
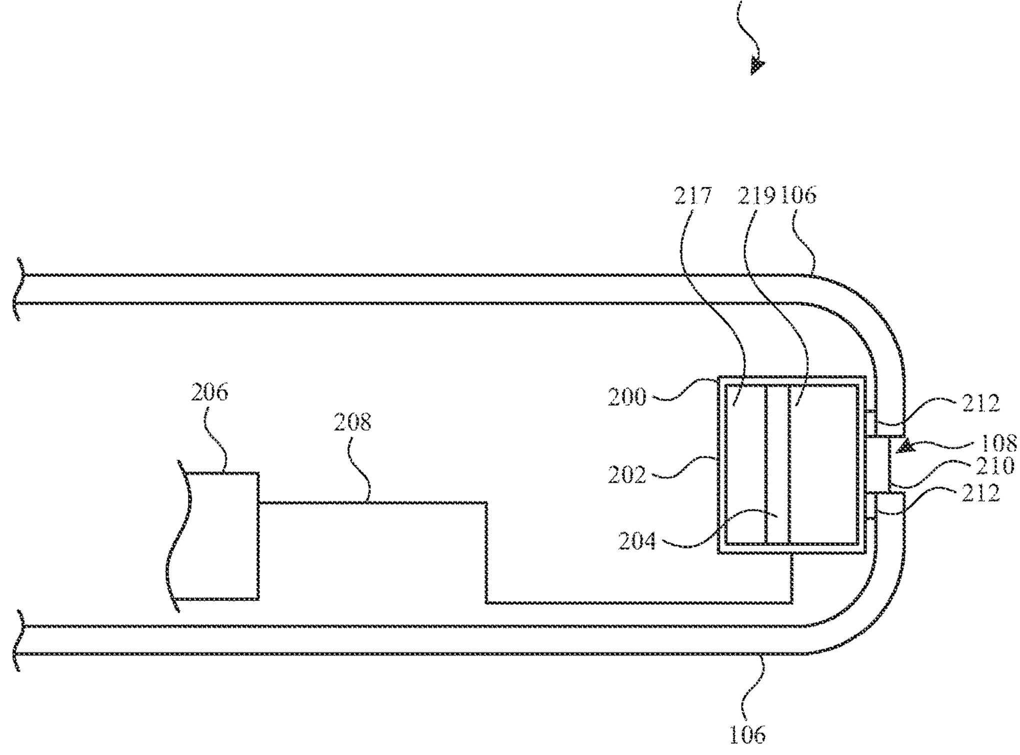
FIG. 2 illustrates a cross-sectional side view of a portion of an example electronic device having a MEMS speaker in accordance with various aspects of the subject technology.

FIG. 2 illustrates a cross-sectional view of a portion of device 100 in which an audio component is mounted. In the example of FIG. 2, device 100 includes speaker 200. Speaker 200 includes speaker housing 202 mounted adjacent at least one opening 108 in housing 106. Speaker housing 202 may be formed form one or more materials such as plastic, metal, and/or a MEMS material. As shown, speaker 200 may include a MEMS component 204, which may be disposed within and/or form a part or all of the speaker housing 202. As shown in FIG. 2, the MEMS component 204 may be mounted between a back volume 217 and a front volume 219 (e.g., as defined by the speaker housing 202 and/or one or more portions of the housing 106). In one or more implementations, some or all of the back volume 217 may be formed within portions of the MEMS component 204 as described in further detail hereinafter.

As illustrated in FIG. 2, speaker housing 202 may include an opening that is aligned with opening 108 in housing 106 so that sound generated by MEMS component 204 (e.g., responsive to control signals received from device circuitry 206) can be transmitted through the opening 108 to the external environment. Opening 108 may be an open port or may include a cover 210 such as a membrane or a mesh structure that discourages entry of liquid into speaker housing 202, but that is permeable to sound and air.

MEMS component 204 may be coupled to device circuitry such as device circuitry 206 (e.g., one or more processors of the device) via a connector 208. Connector 208 may include a flexible integrated circuit or another flexible or rigid conductive connector. In one or more implementations, connector 208 may electrically couple to one or more contacts on speaker housing 202 that are electrically coupled (e.g., via wire bonds or other conductive connections) to MEMS component 204. However, it should be appreciated that, in one or more implementations, MEMS component 204 may be provided without a separate speaker housing 202 (e.g., and coupled directly to connector 208 and/or device circuitry 206). In implementations in which MEMS component 204 is provided without a separate speaker housing, an outer layer (e.g., a top substrate) of the MEMS component 204 can be attached to an inner surface of housing 106 (e.g., by adhesive 212 or another coupling mechanism), mounted to a printed circuit (e.g., connector 208) within device 100, or otherwise mounted within housing 106 so as to project sound out of housing 106 through opening 108.

Figure 3:
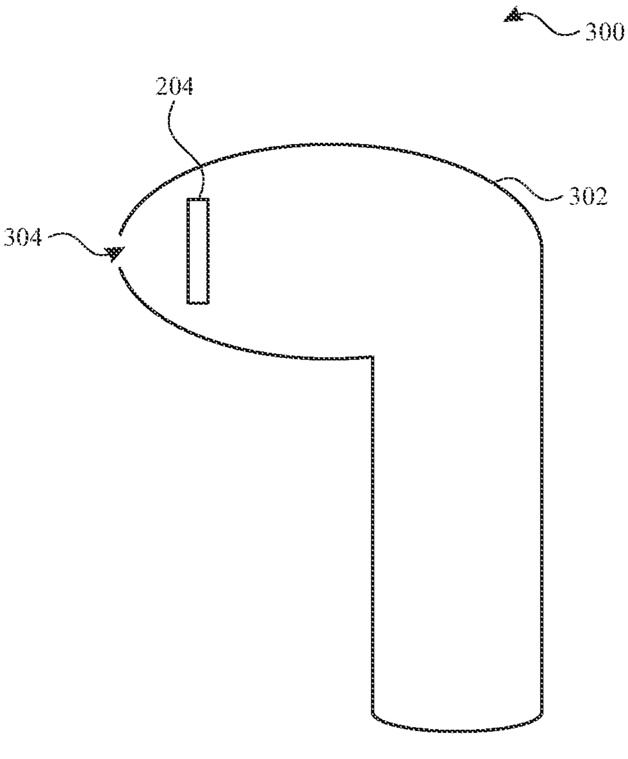
FIG. 3 illustrates a cross-sectional side view of another example electronic device having a MEMS speaker in accordance with various aspects of the subject technology.

FIG. 3 illustrates a cross-sectional view of another example electronic that may include a MEMS speaker. In the example of FIG. 3, a device 300 is implemented as an earbud having a MEMS speaker formed by a MEMS component 204. As shown, device 300 may include a housing 302 having a shape that is configured to fill the opening of an ear canal of a user wearing the earbud. Device 300 may include one or more openings, such as an opening 304 in the housing 302. Housing 302 may have a size and a shape that conforms to a portion of an outer ear, such that opening 304 may be aligned with the ear canal of the user when the earbud is worn by the user, to allow sound generated by MEMS component 204 to enter the user's ear canal. Device 300 may be a wired or wireless earbud that communicates with a companion device such as device 100 of FIG. 1 to receive instructions and/or signals to operate the MEMS speaker corresponding to MEMS component 204 to generate sound. The housing 302 of device 300, a speaker housing within the housing 302, and/or various portions of the MEMS component 204 can form (e.g., define) a back volume and a front volume for the MEMS component 204.

The electronic devices of FIGS. 1 and 3 are merely illustrative, and it should be appreciated that a MEMS speaker having a cylindrical corrugated MEMS structure as described herein can be implemented in any suitable electronic device for which it is desired to generate high quality sound from within a small volume.

Figure 4A:
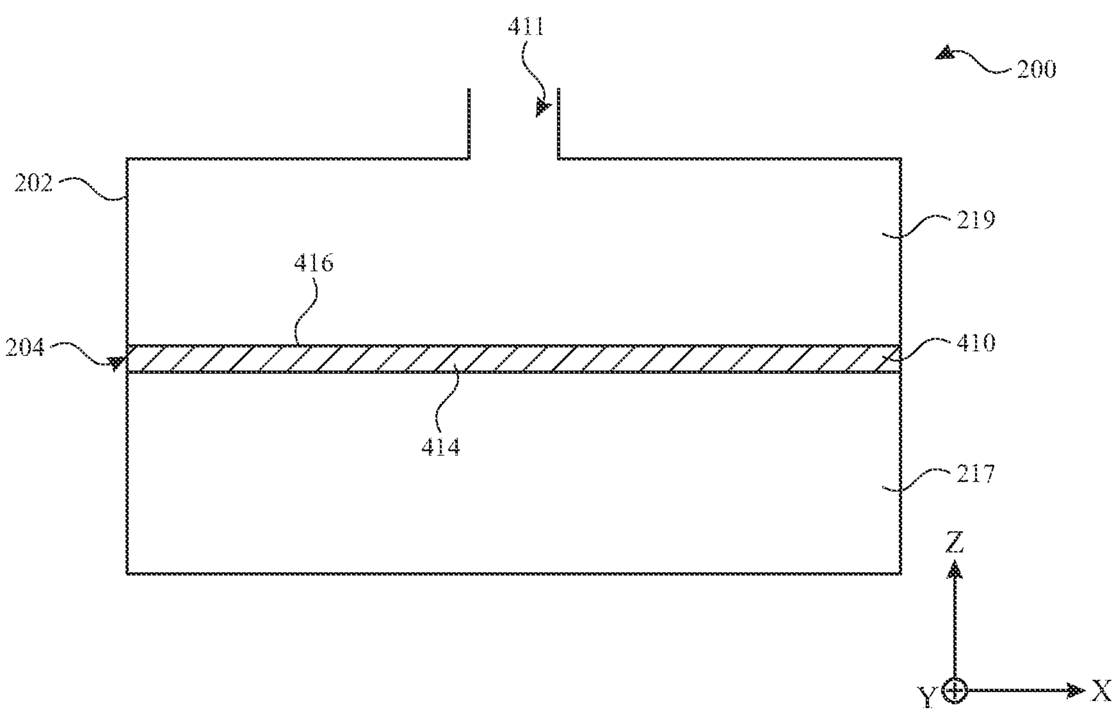
FIG. 4A illustrates a schematic cross-sectional side view of an example MEMS speaker in accordance with various aspects of the subject technology.

FIG. 4A shows a cross-sectional side view of a portion of an example speaker for an electronic device, in an implementation in which a MEMS actuator (or transducer) is implemented as a MEMS speaker. In the example of FIG. 4A, speaker 200 includes one or more MEMS structures 410 of the MEMS component 204, which is disposed between back volume 217 and front volume 219. FIG. 4A illustrates an arrangement in which the MEMS structures 410 are arranged in a plane defined by x and y directions, with the front and back volumes disposed on opposing sides of the MEMS component 204 in a z direction. For example, the MEMS component 204 may include a substrate 414 that separates the MEMS structures 410 from the back volume 217 and a substrate 416 that separates the MEMS structures 410 from the front volume 219. For example, the substrate 416 may include a first set of one or more openings that allow air to flow between spaces (e.g., open cylindrical cores of cylindrical corrugated MEMS structures, as described in further detail hereinafter) within the MEMS component 204 and the front volume 219, and second set of one or more openings that allow air to flow between other spaces (e.g., spaces between cylindrical corrugated MEMS structures, as described in further detail hereinafter) within the MEMS component 204 and the back volume 217.

Figure 4B:
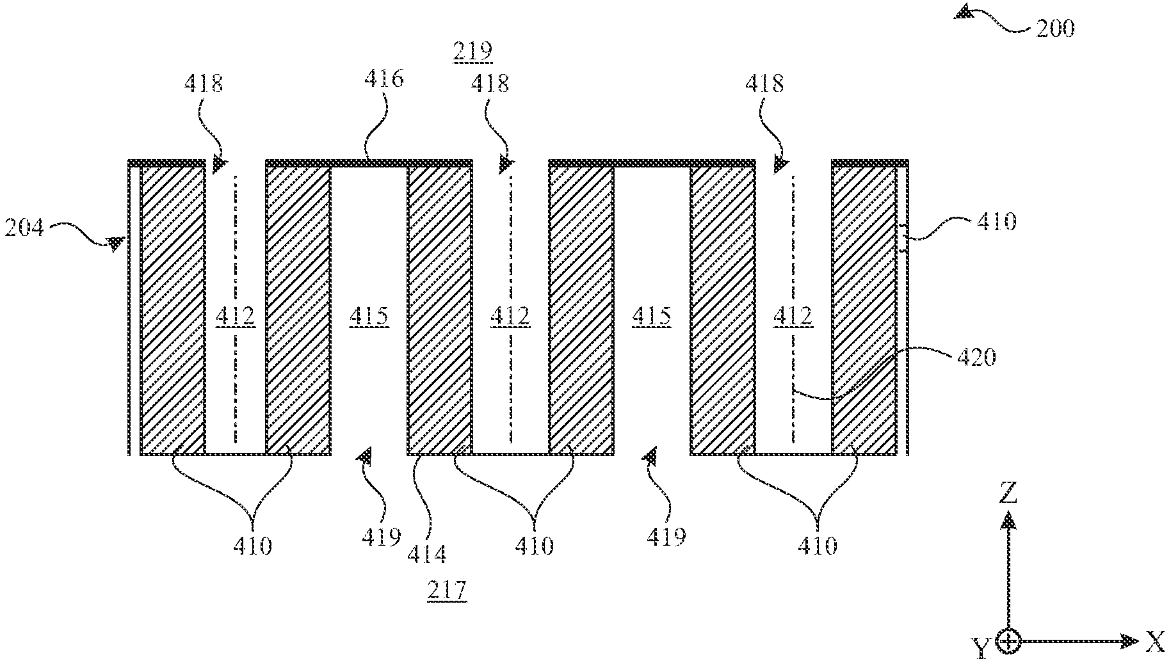
FIG. 4B illustrates a schematic cross-sectional side view of an example MEMS component for a MEMS speaker in accordance with various aspects of the subject technology.

For example, FIG. 4B illustrates a cross-sectional side view of a portion of the MEMS component 204 of FIG. 4A. In the example of FIG. 4B, the MEMS structures 410 of the MEMS component 204 are implemented as cylindrical corrugated MEMS structures. The MEMS structure 410 may be formed from one or more MEMS materials, such as silicon, germanium, and/or gallium arsenide. One or more portions of the MEMS structure 410 may be formed from other materials such as polymers, metals, ceramics, or the like in various implementations.

As shown, each of the cylindrical corrugated MEM structures may define an open cylindrical core 412 that extends along an axis 420 (e.g., an axis that is aligned with the z-direction of FIG. 4B, and extends along a direction between the front volume 219 and the back volume 217). FIG. 4B illustrates an arrangement in which the open cylindrical cores 412 are fluidly coupled to the front volume 219 by a first set of openings 418 in the substrate 416. In this example, spaces 415 between the cylindrical corrugated MEMS structures are fluidly coupled to the back volume 217 by a second set of openings 419 in the substrate 414. As shown, the openings 418 in the substrate 416 may be misaligned with the openings 418 in the substrate 416 (e.g., in one or more implementations, the open cylindrical core 412 of a cylindrical corrugated MEMS structure may be fluidly coupled to an opening 418 in the substrate 416, and the substrate 414 may include an additional opening 419 that is fluidly coupled to the back volume 217 and that is misaligned with the opening 418 in the substrate 416).

The arrangement of FIGS. 4A and 4B is merely illustrative and other arrangements are contemplated and described herein. For example, the MEMS component 204 of FIG. 4B may be disposed within a speaker housing 202 between a front volume 219 and a back volume 217 as in the example of FIG. 4A, or the MEMS component 204 of FIG. 4B may be provided without a surrounding speaker housing 202 (e.g., and the front volume of the speaker may be formed by the open cylindrical cores 412 of the MEMS component 204, and the back volume of the speaker may be formed by the spaces 415 between the cylindrical corrugated MEMS structures) in one or more implementations.

As described in further detail herein, speaker 200 may be operated by applying a voltage to the cylindrical corrugated microelectromechanical systems (MEMS) structures (e.g., to electrodes formed by portions of corrugations of the cylindrical corrugated MEMS structures). For example, applying the voltage may cause a deformation of each of the cylindrical corrugated MEMS structures into and/or out of the open cylindrical cores 412 to move air within open cylindrical cores 412 (e.g., and between the open cylindrical cores 412 and the front volume 219) to generate sound. In one or more implementations, the sound that is generated may pass through the opening 411 in a speaker housing and/or through one or more openings in a device housing to provide sound for an electronic device, such as for one of the devices 100 and 300 of FIGS. 1 and 3.

Figure 5:
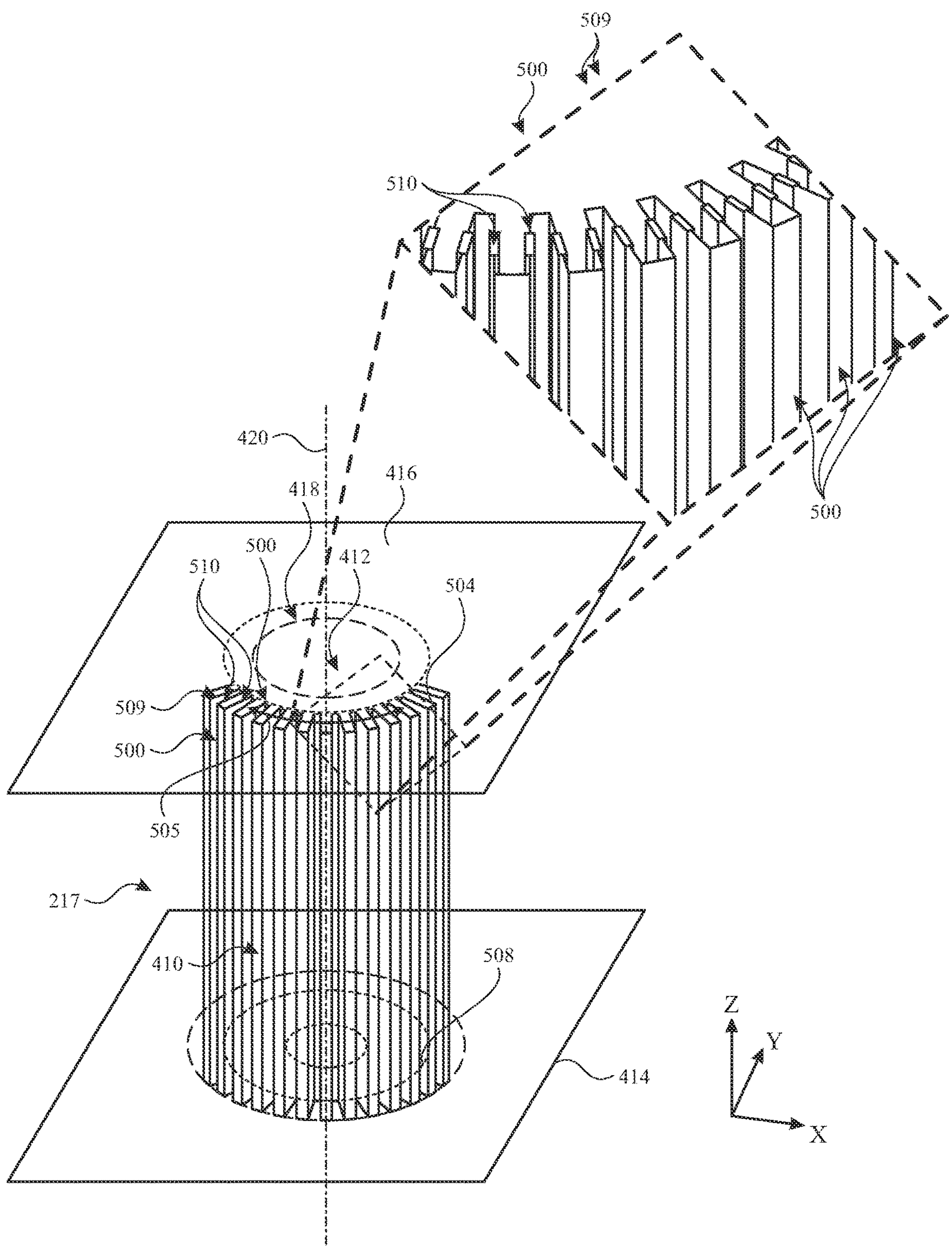
FIG. 5 illustrates a perspective view of a portion of an example MEMS speaker having cylindrical corrugated MEMS structure in accordance with various aspects of the subject technology.

FIG. 5 illustrates a perspective view of an implementation in which a MEMS structure 410 is implemented as a cylindrical corrugated microelectromechanical (MEMS) structures. As shown in FIG. 5, in one or more implementations, a cylindrical corrugated MEMS structure may extend in a circumferential direction 505 around an open cylindrical core 412 that extends along an axis 420. In one or more implementations, the cylindrical corrugated MEMS structure includes a single contiguous structure that extends in the circumferential direction 505 around the open cylindrical core 412 and includes a plurality of corrugations 509 around the circumferential direction 505.

In one or more implementations, each of the corrugations 509 includes an electrode 510 that extends in a first dimension parallel to the axis 420 of the open cylindrical core 412 and in a second dimension that extends radially outward from the axis 420. Each of the corrugations may also include a folded portion 500 (e.g., a first folded portion, also referred to herein as a fold) that extends from a first end of the electrode around a first fold to a first adjacent electrode 510 on a first side of that electrode. Each of the corrugations 509 may also include a folded portion 500 (e.g., a second folded portion) that extends from a second end of the electrode around a second fold to a second adjacent electrode 510 on a second side of that electrode 510. In one or more implementations, the folded portions 500 and the electrodes 510 may be formed from the same material (e.g., a MEMS material). In one or more implementations, the folded portions 500 may have a cross-sectional thickness that is less than a cross-sectional thickness of the electrodes 510. In one or more implementations, the folded portions 500 may include sub structures, such as thinned portions, sub-corrugated portions, and/or tented portions that facilitate flexing and/or bending of the folded portions 500. In one or more implementations, one or more of the folded portions 500 may include an insulating element that electrically insulates the electrode 510 of a corrugation from the electrode 510 of an adjacent corrugation.

Figures 6, 7:
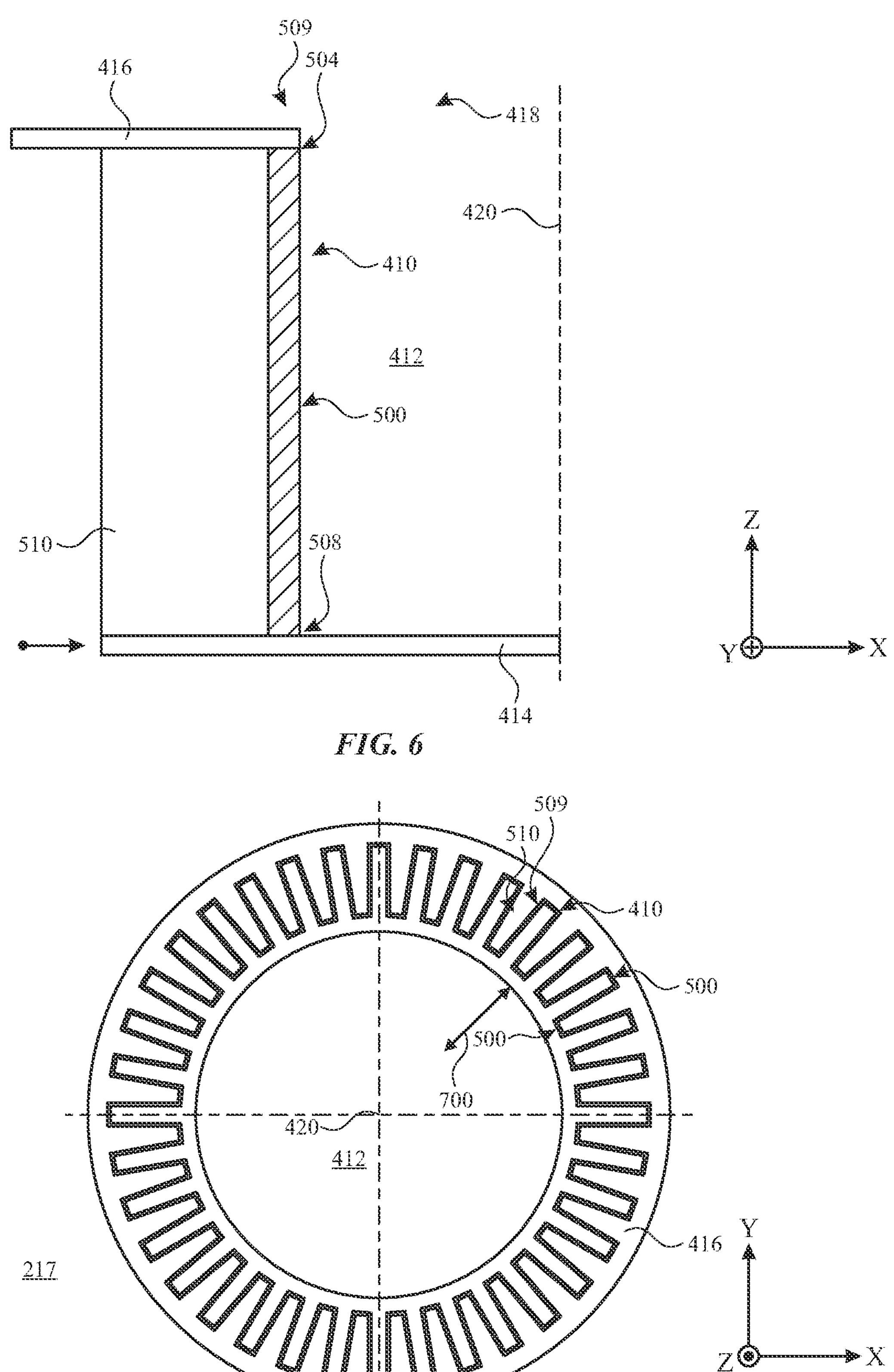
FIG. 6 illustrates a cross-sectional side view of a portion of an example MEMS speaker having an example cylindrical corrugated MEMS structure in accordance with various aspects of the subject technology.
FIG. 7 illustrates a top view of a portion of an example MEMS speaker having an example cylindrical corrugated MEMS structure in accordance with various aspects of the subject technology.

In one or more implementations, each of the corrugations 509 may include an edge 504 (e.g., a first edge or top edge) that is fixed and sealed to the substrate 416. In one or more implementations, each of the corrugations includes an edge 508 (e.g., a second edge or bottom edge) that is fixed and sealed to the substrate 414. For example, FIG. 6 illustrates a cross-sectional side view of a portion of a corrugation 509, showing the edge 504 sealingly fixed to the substrate 416 and the edge 508 of the corrugation 509 sealingly fixed to the substrate 416. As shown in FIG. 6, in one or more implementations, the open cylindrical core 412 of the cylindrical corrugated MEMS structure is fluidly coupled to an opening 418 in the substrate 416. In this way, air can be into and/or out of the open cylindrical core 412 to generate sound, and air can be prevented from leaking around the cylindrical corrugated MEMS structure (e.g., around the edges 504 and 508) between the front volume 219 and the back volume 217.

Figure 8:
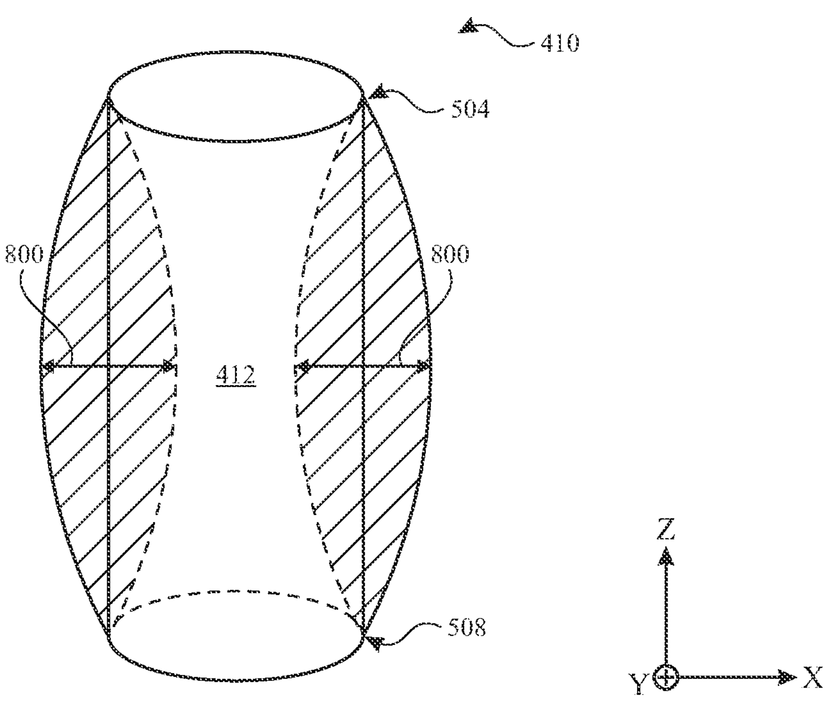
FIG. 8 illustrates an example deformation of a cylindrical corrugated MEMS structure in accordance with various aspects of the subject technology.

FIG. 7 illustrates a top view of a portion of the cylindrical corrugated MEMS structure of FIG. 5. As illustrated in FIG. 7, in one or more implementations, a portion of each of the corrugations of the cylindrical corrugated MEMS structure may be configured to, responsive to an applied voltage, bend into and/or out of the open cylindrical core (e.g., as indicated by arrows 700) to move air within (e.g., into and/or out of) the open cylindrical core 412 (e.g., between the open cylindrical core 412 and the front volume 219). For example, as illustrated in the side perspective view of FIG. 8, the cylindrical corrugated MEMS structure may bend (e.g., as indicated by arrows 800) at locations between the edge 504 and the edge 508, such as into and/or out of the open cylindrical core 412. In this way, actuation of the cylindrical corrugated MEMS structure can deform or bend the corrugations 509 to move air to generate sound, even while the edges 504 and 508 of the corrugations 509 are fixed. In one or more other implementations, the edge 508 may be a free edge that can swing relative to the fixed edge at edge 504 to move the air within the open cylindrical core 412 to generate sound. As illustrated in FIGS. 6 and 7, the open cylindrical core 412 may be defined, in part, by interior folded portions 500 of the corrugations 509.

In the examples of FIGS. 5-8, actuation of the cylindrical corrugated MEMS structure can be achieved by applying a voltage to the electrodes 510 of the corrugations 509, so that the electrodes 510 repel and attract each other to generate the actuation and resulting deformations of the corrugations. In one or more other implementations, the MEMS component 204 may be provided with one or more fixed electrodes in addition to the electrodes 510 of the cylindrical corrugated MEMS structure.

Figure 9:
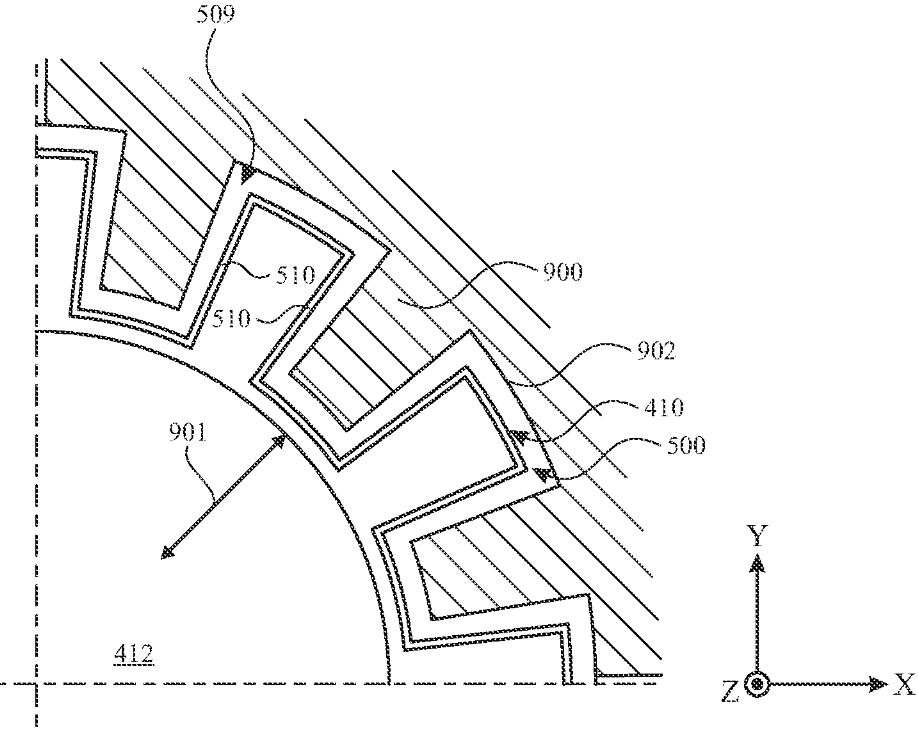
FIG. 9 illustrates a top view of a portion of another example MEMS speaker having a cylindrical corrugated MEMS structure in accordance with various aspects of the subject technology.

For example, FIG. 9 illustrates an example implementation in which MEMS speaker includes fixed radial electrodes 900. As shown in FIG. 9, each of the fixed radial electrodes 900 may be disposed between a respective pair of adjacent electrodes 510 of the cylindrical corrugated MEMS structure. In this way, when a voltage is applied to the fixed radial electrodes 900 and/or to the electrodes 510 of the cylindrical corrugated MEMS structure, the electrodes 510 may be repelled and/or attracted to the fixed radial electrodes 900 (e.g., as indicated by arrows 901) to cause the corrugations 509 to deform or bend into and/or out of the open cylindrical core 412 (e.g., as described above in connection with FIG. 8). In one or more implementations, the fixed radial electrodes 900 may be formed by protrusions or other electrode structures that extend from an internal cylindrical wall of a casing 902 within which the cylindrical corrugated MEMS structure is disposed. As shown, the fixed radial electrodes 900 may extend in the direction of the cylindrical corrugated MEMS structure toward the open cylindrical core (e.g., along a substantially radial direction toward the axis 420), without contacting or passing through the cylindrical corrugated MEMS structure.

Figures 10, 11:
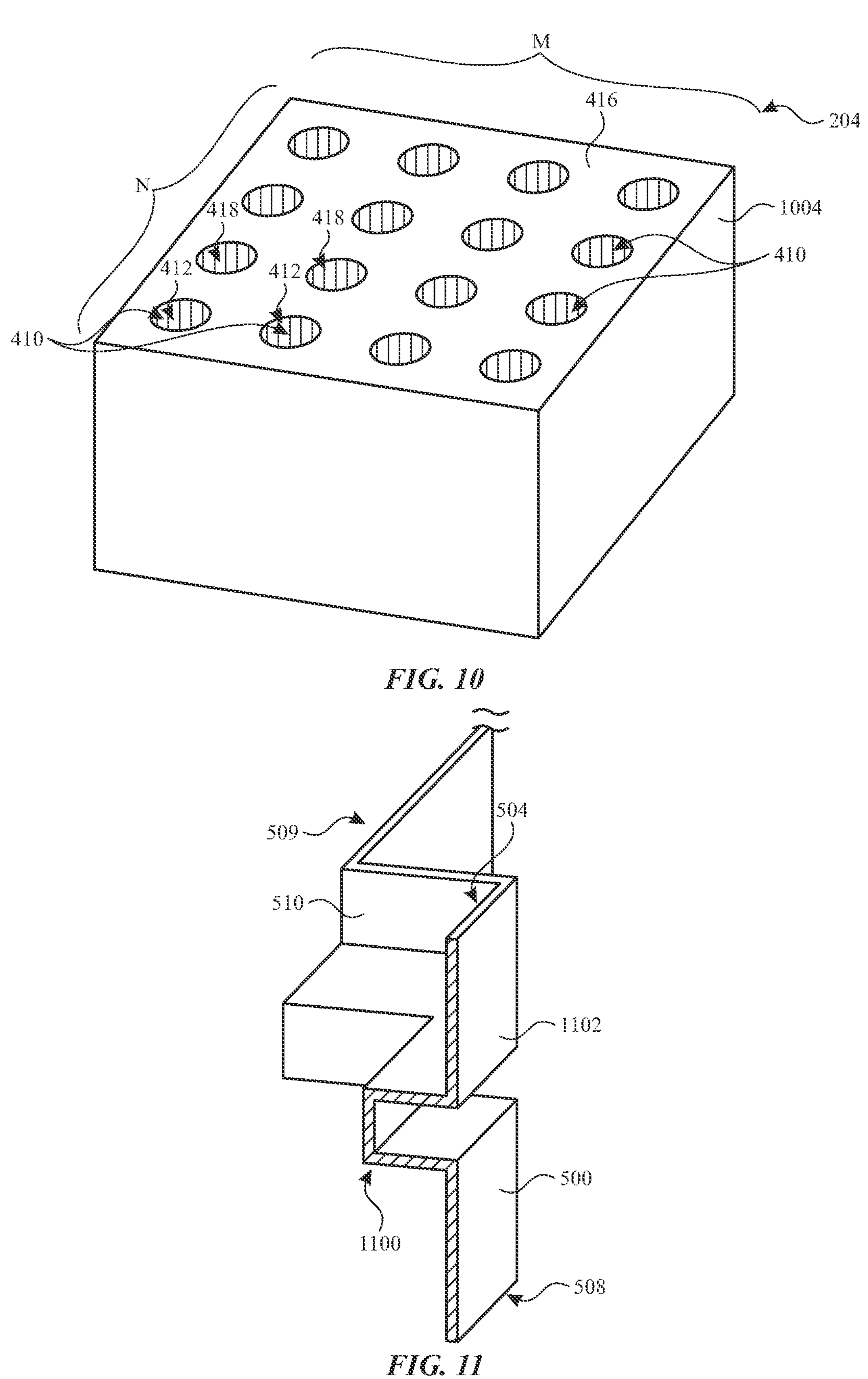
FIG. 10 illustrates an example array of cylindrical corrugated MEMS structures for a MEMS speaker in accordance with various aspects of the subject technology.
FIG. 11 illustrates an example portion of a cylindrical corrugated MEMS structure for a MEMS speaker in accordance with various aspects of the subject technology.

As discussed herein (e.g., in connection with FIG. 4B), in one or more implementations, a MEMS speaker may include multiple MEMS structures 410 that are implemented as cylindrical corrugated MEMS structures as described herein. For example, as shown in FIG. 10, the MEMS component 204 (e.g., which may be disposed between the front volume 219 and the back volume 217, as shown in FIGS. 4A and/or 4B) may include an array of cylindrical MEMS structures. In the example of FIG. 10, the MEMS component 204 includes an n×m array of MEMS structures 410, each implemented as a cylindrical corrugated MEMS structure (where n is the number of rows of MEMS structures 410 and the m is the number of columns of MEMS structure 410).

As shown, each of the cylindrical corrugated MEMS structures in the array may define a respective open cylindrical core 412 that extends along a respective axis (e.g., a respective axis 420) that is parallel to axes of additional cylindrical corrugated MEMS structures in the array (e.g., in a direction that runs between the front volume 219 and the back volume 217). The MEMS structures 410 of the array can be operated in unison (e.g., with a common applied voltage at a common time) or can be operated asynchronously (e.g., with varying amounts of voltage across the array at various times) to generate sounds of various frequencies. In one or more implementations, the MEMS structures 410 of an array of cylindrical corrugated MEMS structures can be substantially the same size, or can have varying sizes (e.g., varying electrode sizes, and/or varying core diameters of the open cylindrical cores) across the array. In one or more implementations, multiple arrays of cylindrical corrugated MEMS structures can be disposed in a speaker.

As shown in FIG. 10, the open cylindrical cores 412 of the cylindrical corrugated MEMS structures may be aligned with the openings 418 in the substrate 416. Although not visible in FIG. 10 (see, e.g., FIG. 4B), openings 419 in the substrate 414 may be misaligned with the openings 418 and fluidly coupled to the spaces 415 (see., e.g., FIG. 4B) between the cylindrical corrugated MEMS structures of the array (e.g., and to the back volume 217). As shown in FIG. 10, the array of cylindrical corrugated MEMS structures may be substantially enclosed (e.g., except for the openings 418 and the openings 419) in an enclosure having sidewalls 1004 that extend between the substrate 414 and the substrate 416. The sidewalls 1004 may be sidewalls of a separate enclosure for the array of cylindrical corrugated MEMS structures, or may be formed by a portion of the speaker housing 202.

As described herein (e.g., in connection with FIGS. 7-9), applying a voltage to a cylindrical corrugated MEMS structure that has fixed edges (e.g., top and bottom edges, such as edges 504 and 508) can cause the corrugations of the cylindrical corrugated MEMS structure to bend or otherwise deform to move air to generate sound. In one or more implementations, the corrugations 509 may be formed from a MEMS material and/or with a thickness that allows the corrugations 509 to be compliant and bend responsive to an applied voltage. In one or more other implementations, one or more corrugations 509 may be provided with a compliant feature that facilitates deformation or bending of the corrugations.

For example, FIG. 11 illustrates an example of a corrugation 509 that includes a compliant feature 1100. In the example of FIG. 11, the compliant feature 1100 is formed by a transverse fold (e.g., a fold that is oriented transverse to the fold orientation of the folded portion 500) at or near the center (e.g., with respect to the edges 504 and 508) of the corrugation 509. In this example, the folded portion 500 of the corrugation 509 includes an outer portion 1102 that extends along a direction that is parallel to the axis 420 of the cylindrical corrugated MEMS structure, and the transverse fold that forms the compliant feature 1100 includes a first portion that extends radially away from the outer portion 1102 (e.g., toward the open cylindrical core), a second portion that extends in parallel with the outer portion 1102, and a third portion that extends from the second portion radially away from the outer portion 1102 (e.g., toward the open cylindrical core to the second portion). For example, in one or more implementations, a first folded portion 500 (e.g., an outer fold) or a second folded portion 500 (e.g., an inner fold) of one or more of the corrugations 509 includes a compliant feature 1100 that facilitates the bend of the corrugations 509 responsive to an applied voltage.

In the example of FIG. 11, the transverse fold that forms the compliant feature 1100 is formed in the folded portion 500 and the electrode 510 of the corrugation 509. In this way, the transverse fold may facilitate bending and/or other deforming of the folded portion 500 and/or the electrode 510 when a voltage is applied to the electrode 510. In one or more other implementations, a compliant feature 1100 may be formed on the folded portion 500 of a corrugation 509 and not on an electrode 510 of the corrugation, or on the electrode 510 of the corrugation 509 and not on the folded portion 500 of the corrugation 509. In the example of FIG. 11, the compliant feature 1100 is formed from a transverse fold. However, in one or more other implementations, the compliant feature 1100 may be formed from other variations of the shape of the corrugation 509, from a thinned portion of the corrugation 509, and/or from one or more different materials (e.g., different from the material from which the cylindrical corrugated MEMs structure is formed) formed on, within, and/or between portions of the corrugation 509.

Figure 12:
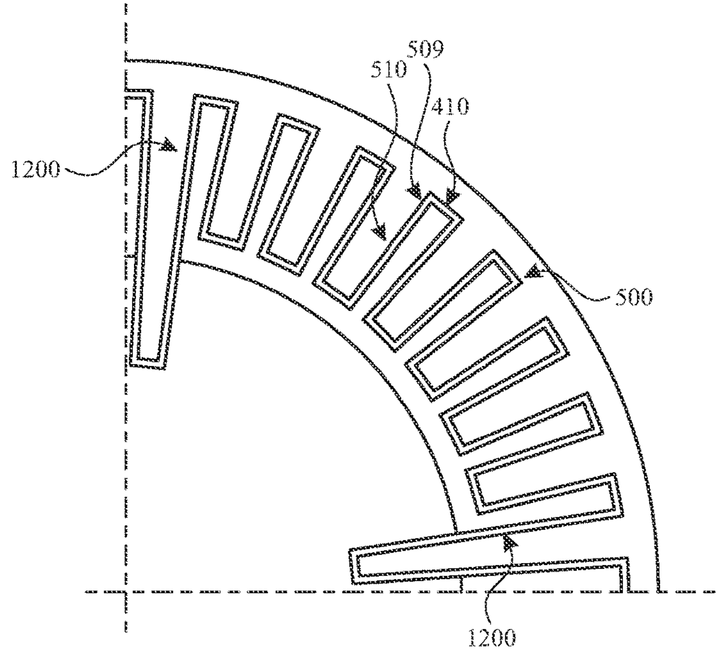
FIG. 12 illustrates a top view of a portion of an example MEMS speaker having an example cylindrical corrugated MEMS structure with compliant corrugations in accordance with various aspects of the subject technology.

In the example of FIG. 11, one or more of the corrugations 509 includes a portion that forms a compliant feature 1100. In one or more other implementations, one or more of the corrugations 509 may be compliant corrugations that have a compliance that is greater than one or more others of the corrugations and that facilitate the bend of the corrugations responsive to the applied voltage. For example, FIG. 12 illustrates a top view of a portion of a cylindrical corrugated MEMS structure in which the corrugations 509 of the MEMS structure 410 include compliant corrugations 1200 (e.g., at 90 degree intervals or other intervals around the circumferential direction of the cylindrical corrugated MEMS structure). As examples, the compliant corrugations 1200 may be formed from a different material from the other corrugations 509 or may be formed from the same material as the other corrugations 509 and have a thinned cross-sectional thickness relative to the cross-sectional thickness of the other corrugations 509. In one or more implementations, the compliant corrugations 1200 may be formed without an electrode 510. In one or more implementations, the compliant corrugations may have a radial length that is different from the radial lengths of other corrugations 509 (e.g., that extend further into the open cylindrical core 412 than the other corrugations 509, as illustrated in FIG. 12.

Figure 13:
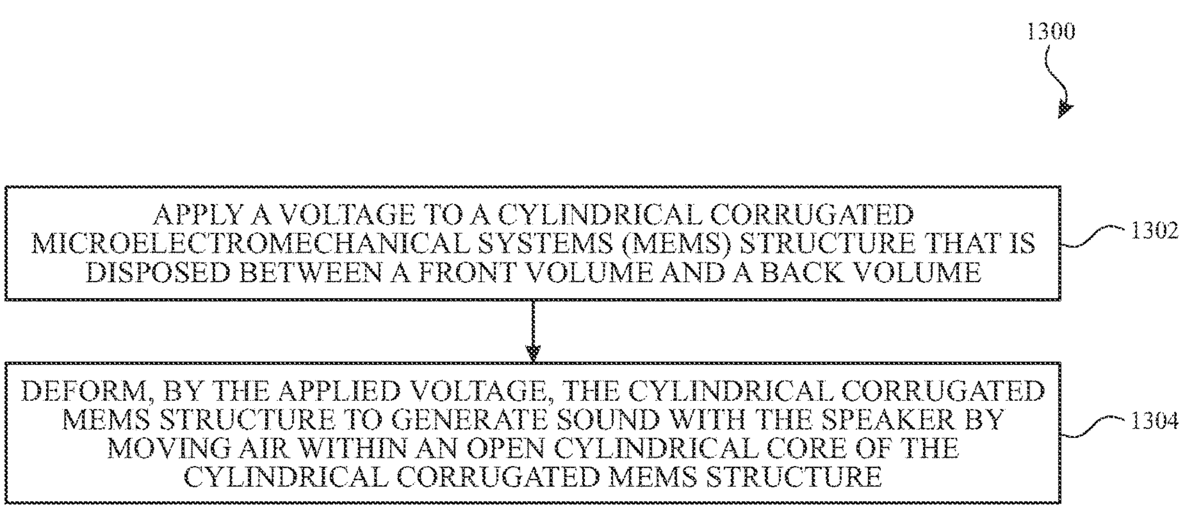
FIG. 13 illustrates a flow diagram of an example process for operating a MEMS speaker having a cylindrical corrugated MEMS structure in accordance with one or more implementations.

FIG. 13 illustrates a flow diagram of an example process for operating a MEMS speaker having a cylindrical corrugated MEMS structure in accordance with one or more implementations. For explanatory purposes, the process 1300 is primarily described herein with reference to the device 100 of FIG. 1 or the device 300 of FIG. 3. However, the process 1300 is not limited to device 100 of FIG. 1 or the device 300 of FIG. 3, and one or more blocks (or operations) of the process 1300 may be performed by one or more other components and other suitable devices (e.g., any electronic device including a MEMS speaker with cylindrical corrugated MEMS structure as described herein). Further for explanatory purposes, the blocks of the process 1300 are described herein as occurring in serial, or linearly. However, multiple blocks of the process 1300 may occur in parallel. In addition, the blocks of the process 1300 need not be performed in the order shown and/or one or more blocks of the process 1300 need not be performed and/or can be replaced by other operations.

In the example of FIG. 13, at block 1302, a voltage may be applied to a cylindrical corrugated microelectromechanical (MEMS) structure (e.g., a MEMS structure 410 as described herein) that is disposed between a front volume (e.g., front volume 219) and a back volume (217). For example, the voltage may be applied to electrodes 510 of the cylindrical corrugated MEMS structure. In one or more implementations, a voltage may be applied to one or more fixed radial electrodes that are positioned between the electrodes 510 of the cylindrical corrugated MEMS structure.

In one or more implementations, a central cylindrical core of the cylindrical corrugated MEMS structure may be fluidly coupled to and/or may form some or all of the front volume. For example, the cylindrical corrugated MEMS structure may extend in a circumferential direction around an open cylindrical core that extends along an axis and that defines at least a portion of the front volume. The cylindrical corrugated MEMS structure may extend in a circumferential direction around an open cylindrical core that extends along an axis that runs between the front volume and the back volume. The cylindrical corrugated MEMS structure may include a single contiguous structure that extends in the circumferential direction around the open cylindrical core and that includes a plurality of corrugations around the circumferential direction.

In one or more implementations, each of the corrugations includes an electrode that extends in a first dimension parallel to the axis of the open cylindrical core and in a second dimension that extends in a second dimension radially outward from the axis and at least one folded portion that extends from a first end of the electrode around a first fold to a first adjacent electrode on a first side of the electrode. A corrugation may also include a second folded portion that extends from a second end of the electrode around a second fold to a second adjacent electrode on a second side of the electrode.

In one or more implementations, the voltage (and/or another voltage) may also be applied to one or more additional cylindrical corrugated MEMS structures, such as cylindrical corrugated MEMS structures in an array of cylindrical corrugated MEMS structures. As examples, the same voltage can be applied at the same time to the additional cylindrical corrugated MEMS structures, one or more different voltages can be applied to one or more additional cylindrical corrugated MEMS structures at the same time that the voltage is applied to the cylindrical corrugated MEMS structure, and/or one or more different voltages can be applied to one or more additional cylindrical corrugated MEMS structures at different times from the time at which the voltage is applied to the cylindrical corrugated MEMS structure.

At block 1304, the cylindrical corrugated MEMS structure may be deformed, by the applied voltage, to generate sound with the speaker by moving air within an open cylindrical core (e.g., open cylindrical core 412) of the cylindrical corrugated MEMS structure. For example, moving air within the open cylindrical core may include moving air between the open cylindrical core of the cylindrical corrugated MEMS structure and the front volume. For example, deforming the cylindrical corrugated MEMS structure may include bending a central portion of the cylindrical corrugated MEMS structure into the open cylindrical core to push air out of the open cylindrical core (e.g., as described herein in connection with FIGS. 7, 8, and/or 9). Deforming the cylindrical corrugated MEMS structure may include bending a central portion of the cylindrical corrugated MEMS structure out of the open cylindrical core to pull air into the open cylindrical core (e.g., as described herein in connection with FIGS. 7, 8, and/or 9). For example, the cylindrical corrugated MEMS structure may include top and bottom edges (e.g., edges 504 and 508 described herein) that are sealingly fixed to respective top and bottom substrates (e.g., substrates 416 and 414 described herein) such that the top and bottom edges remain in a fixed portion while the central portion of the cylindrical corrugated MEMS structure bends into and/or out of the open cylindrical core.

In one or more other implementations, deforming the cylindrical corrugated MEMS structure may include moving a free end (e.g., at the edge 508) of the cylindrical corrugated MEMS structure that is opposite to a fixed end (e.g., at the edge 504) of the cylindrical corrugated MEMS structure into (e.g., and/or out of) the open cylindrical core. In one or more implementations, one or more additional cylindrical corrugated MEMS structures may be deformed along with the cylindrical corrugated MEMS structure to move air within one or more respective additional open cylindrical cores of the one or more additional cylindrical corrugated MEMS structures.

In one or more implementations, moving the air causes sound to be generated by the cylindrical corrugated MEMS structure(s). For example, in one or more implementations, a voltage that is applied to a cylindrical corrugated MEMS structure may be applied, removed, and/or varied with a frequency that causes moving air within an open cylindrical core thereof to generate sound at a desired audio frequency.

Figure 14:
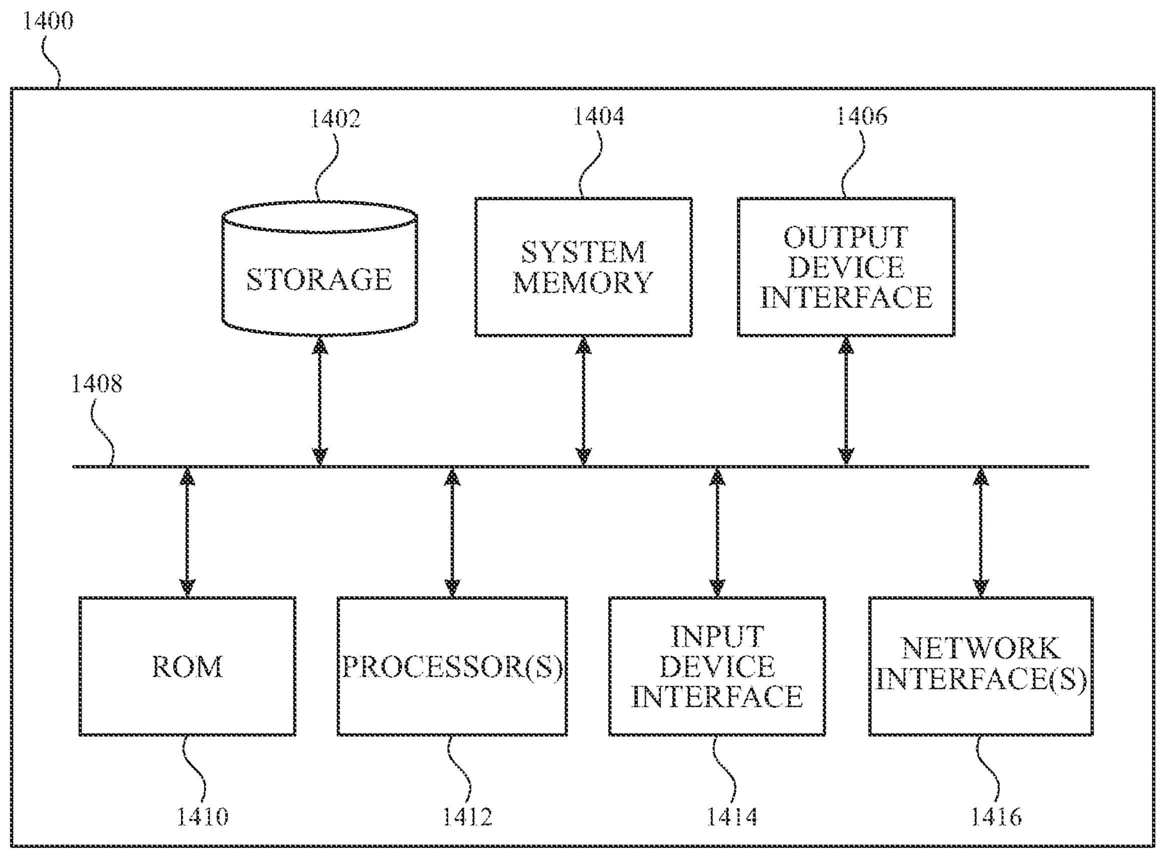
FIG. 14 illustrates an electronic system with which one or more implementations of the subject technology may be implemented.

FIG. 14 illustrates an electronic system 1400 with which one or more implementations of the subject technology may be implemented. The electronic system 1400 can be, and/or can be a part of, one or more of the devices 100 or 300 shown in FIG. 1. The electronic system 1400 may include various types of computer readable media and interfaces for various other types of computer readable media. The electronic system 1400 includes a bus 1408, one or more processing unit(s) 1412, a system memory 1404 (and/or buffer), a ROM 1410, a permanent storage device 1402, an input device interface 1414, an output device interface 1406, and one or more network interfaces 1416, or subsets and variations thereof.

The bus 1408 collectively represents all system, peripheral, and chipset buses that communicatively connect the numerous internal devices of the electronic system 1400. In one or more implementations, the bus 1408 communicatively connects the one or more processing unit(s) 1412 with the ROM 1410, the system memory 1404, and the permanent storage device 1402. From these various memory units, the one or more processing unit(s) 1412 retrieves instructions to execute and data to process in order to execute the processes of the subject disclosure. The one or more processing unit(s) 1412 can be a single processor or a multi-core processor in different implementations.

The ROM 1410 stores static data and instructions that are needed by the one or more processing unit(s) 1412 and other modules of the electronic system 1400. The permanent storage device 1402, on the other hand, may be a read-and-write memory device. The permanent storage device 1402 may be a non-volatile memory unit that stores instructions and data even when the electronic system 1400 is off. In one or more implementations, a mass-storage device (such as a magnetic or optical disk and its corresponding disk drive) may be used as the permanent storage device 1402.

In one or more implementations, a removable storage device (such as a floppy disk, flash drive, and its corresponding disk drive) may be used as the permanent storage device 1402. Like the permanent storage device 1402, the system memory 1404 may be a read-and-write memory device. However, unlike the permanent storage device 1402, the system memory 1404 may be a volatile read-and-write memory, such as random access memory. The system memory 1404 may store any of the instructions and data that one or more processing unit(s) 1412 may need at runtime. In one or more implementations, the processes of the subject disclosure are stored in the system memory 1404, the permanent storage device 1402, and/or the ROM 1410. From these various memory units, the one or more processing unit(s) 1412 retrieves instructions to execute and data to process in order to execute the processes of one or more implementations.

The bus 1408 also connects to the input and output device interfaces 1414 and 1406. The input device interface 1414 enables a user to communicate information and select commands to the electronic system 1400. Input devices that may be used with the input device interface 1414 may include, for example, alphanumeric keyboards and pointing devices (also called "cursor control devices"). The output device interface 1406 may enable, for example, the display of images generated by electronic system 1400. Output devices that may be used with the output device interface 1406 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 14, the bus 1408 also couples the electronic system 1400 to one or more networks and/or to one or more network nodes through the one or more network interface(s) 1416. In this manner, the electronic system 1400 can be a part of a network of computers (such as a LAN, a wide area network ("WAN"), or an Intranet, or a network of networks, such as the Internet. Any or all components of the electronic system 1400 can be used in conjunction with the subject disclosure.

In accordance with some aspects of the subject disclosure, a speaker is provided that includes a front volume; a back volume; and a cylindrical corrugated microelectromechanical systems (MEMS) structure disposed between the front volume and the back volume.

In accordance with other aspects of the subject disclosure, a method of operating a speaker is provided, the method including applying a voltage to a cylindrical corrugated microelectromechanical (MEMS) structure that is disposed between a front volume and a back volume; and deforming, by the applied voltage, the cylindrical corrugated MEMS structure to generate sound with the speaker by moving air within an open cylindrical core of the cylindrical corrugated MEMS structure.

In accordance with other aspects of the subject disclosure, an electronic device is provided that includes a speaker, the speaker including a front volume; a back volume; and a cylindrical corrugated microelectromechanical systems (MEMS) structure having an open cylindrical core that at least partially defines the front volume.

In accordance with other aspects of the subject disclosure, a speaker is provided that includes a first substrate having a first plurality of openings; a second substrate having a second plurality of openings that are misaligned with the first plurality of openings; and a cylindrical corrugated microelectromechanical systems (MEMS) structure disposed between the first substrate and the second substrate.

In accordance with other aspects of the subject disclosure, a method of operating a speaker is provided, the method including applying a voltage to a cylindrical corrugated microelectromechanical systems (MEMS) structure that is disposed between a first substrate having a first plurality of openings and a second substrate having a second plurality of openings that are misaligned with the first plurality of openings; and deforming, by the applied voltage, the cylindrical corrugated MEMS structure to generate sound with the speaker.

In accordance with other aspects of the subject disclosure, an electronic device is provided that includes a speaker, the speaker including a first substrate having a first plurality of openings; a second substrate having a second plurality of openings that are misaligned with the first plurality of openings; and a cylindrical corrugated microelectromechanical systems (MEMS) structure disposed between the first substrate and the second substrate.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In one or more implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as ASICs or FPGAs. In one or more implementations, such integrated circuits execute instructions that are stored on the circuit itself.

Various functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

As used in this specification and any claims of this application, the terms "computer", "processor", and "memory" all refer to electronic or other technological devices. These terms exclude people or groups of people. For the purposes of the specification, the terms "display" or "displaying" means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

Many of the above-described features and applications are implemented as software processes that are specified as a set of instructions recorded on a computer readable storage medium (also referred to as computer readable medium).

When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Some of the blocks may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or design.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A speaker, comprising:

a front volume;

a back volume; and a cylindrical corrugated microelectromechanical (MEMS) structure disposed between the front volume and the back volume, wherein the cylindrical corrugated MEMS structure:

extends in a circumferential direction around an open cylindrical core that extends along an axis and that defines at least a portion of the front volume, and includes an electrode of at least one corrugation, the electrode extending in a first dimension parallel to the axis of the open cylindrical core and in a second dimension radially outward from the axis.

2. The speaker of claim 1, wherein the cylindrical corrugated MEMS structure comprises a single contiguous structure that extends in the circumferential direction around the open cylindrical core and that includes a plurality of corrugations, including the at least one corrugation, around the circumferential direction.

3. The speaker of claim 2, wherein each of the plurality of corrugations, including the at least one corrugation, comprises:

a respective electrode that extends in a first dimension parallel to the axis of the open cylindrical core and in a second dimension radially outward from the axis, the respective electrodes including the electrode of the at least one corrugation;

a first folded portion that extends from a first end of the electrode around a first fold to a first adjacent electrode on a first side of the electrode; and a second folded portion that extends from a second end of the electrode around a second fold to a second adjacent electrode on a second side of the electrode.

4. The speaker of claim 3, wherein each of the corrugations comprises a first edge that is fixed and sealed to a first substrate.

5. The speaker of claim 4, wherein each of the corrugations further comprises a second edge that is fixed and sealed to a second substrate.

6. The speaker of claim 5, wherein each of the corrugations of the cylindrical corrugated MEMS structure is configured to, responsive to an applied voltage, bend at a location between the first edge and the second edge to move air within the open cylindrical core.

7. The speaker of claim 6, wherein the first folded portion or the second folded portion of one or more of the corrugations comprises a compliant feature that facilitates the bend of the corrugations responsive to the applied voltage.

8. The speaker of claim 7, wherein one or more of the corrugations are compliant corrugations having a compliance that is greater than one or more others of the corrugations and that facilitates the bend of the corrugations responsive to the applied voltage.

9. The speaker of claim 6, wherein one or more of the corrugations are compliant corrugations having a compliance that is greater than one or more others of the corrugations and that facilitate the bend of the corrugations responsive to the applied voltage.

10. The speaker of claim 5, wherein the open cylindrical core of the cylindrical corrugated MEMS structure is fluidly coupled to an opening in the first substrate.

11. The speaker of claim 10, wherein the second substrate comprises an additional opening that is fluidly coupled to the back volume and that is misaligned with the opening in the first substrate.

12. The speaker of claim 3, further comprising a plurality of fixed radial electrodes, each disposed between a respective pair of adjacent electrodes of the cylindrical corrugated MEMS structure.

13. A speaker, comprising:

a front volume;

a back volume;

a cylindrical corrugated microelectromechanical (MEMS) structure disposed between the front volume and the back volume; and an additional cylindrical corrugated MEMS structure disposed between the front volume and the back volume.

14. The speaker of claim 13, wherein the cylindrical corrugated MEMS structure has a first axis that is parallel to a second axis of the additional cylindrical corrugated MEMS structure and that extends between the front volume and the back volume.

15. The speaker of claim 14, wherein the cylindrical corrugated MEMS structure and the additional cylindrical corrugated MEMS structure are disposed in an array of cylindrical MEMS structures between the front volume and the back volume.

16. A method of operating a speaker, the method comprising:

applying a voltage to a cylindrical corrugated microelectromechanical (MEMS) structure that is disposed between a front volume and a back volume; and deforming, by the applied voltage, the cylindrical corrugated MEMS structure to generate sound with the speaker by moving air within an open cylindrical core of the cylindrical corrugated MEMS structure, wherein deforming the cylindrical corrugated MEMS structure comprises bending a central portion of the cylindrical corrugated MEMS structure into the open cylindrical core to push air out of the open cylindrical core.

17. An electronic device, comprising:

a speaker, comprising:

a front volume;

a back volume; and a cylindrical corrugated microelectromechanical systems (MEMS) structure having an open cylindrical core that defines at least a portion of the front volume, wherein the cylindrical corrugated MEMS structure comprises a free end that is opposite to a fixed end of the cylindrical corrugated MEMS structure, and wherein the free end is configured to move into the open cylindrical core to deform the cylindrical corrugated MEMS structure to generate sound with the speaker by moving air within the open cylindrical core.

18. The electronic device of claim 17, wherein the cylindrical corrugated MEMS structure comprises a single contiguous structure that extends in a circumferential direction around the open cylindrical core and that includes a plurality of corrugations around the circumferential direction.

19. The electronic device of claim 18, wherein the speaker further comprises a substrate and wherein the fixed end of the cylindrical corrugated MEMS structure is fixed and sealed to the substrate.

20. The method of claim 16, wherein the central portion of the cylindrical corrugated MEMS structure is disposed between a first edge that is fixed and sealed to a first substrate and a second edge that is fixed and sealed to a second substrate.

* * * * *